United States Patent
Chen et al.

(10) Patent No.: US 11,670,836 B2
(45) Date of Patent: Jun. 6, 2023

(54) SEMICONDUCTOR DEVICE PACKAGE

(71) Applicant: Advanced Semiconductor Engineering, Inc., Kaohsiung (TW)

(72) Inventors: Ting Ruei Chen, Kaohsiung (TW); Hung-Hsiang Cheng, Kaohsiung (TW); Guo-Cheng Liao, Kaohsiung (TW); Yun-Hsiang Tien, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 98 days.

(21) Appl. No.: 17/084,487

(22) Filed: Oct. 29, 2020

(65) Prior Publication Data

US 2022/0140467 A1    May 5, 2022

(51) Int. Cl.
*H01Q 1/22*    (2006.01)
*H01Q 1/36*    (2006.01)
*H01L 23/66*   (2006.01)
*H01L 23/538*  (2006.01)
*H01Q 19/10*   (2006.01)

(52) U.S. Cl.
CPC ....... *H01Q 1/2283* (2013.01); *H01L 23/5385* (2013.01); *H01L 23/66* (2013.01); *H01Q 1/36* (2013.01); *H01Q 19/104* (2013.01); *H01L 2924/1421* (2013.01)

(58) Field of Classification Search
CPC ...... H01Q 1/2283; H01Q 1/36; H01Q 19/104; H01Q 1/22; H01Q 21/205; H01Q 21/065; H01L 23/66; H01L 23/5385; H01L 23/538; H01L 2223/6677; H01L 2924/1421
See application file for complete search history.

(56) References Cited

U.S. PATENT DOCUMENTS 5,369,202 A * 11/1994  Atwell ................ C08F 12/21
                                                       526/296
10,608,319 B2   3/2020  Kim et al.
10,609,318 B2 * 3/2020  Sakakibara ....... H01L 27/14643

* cited by examiner

*Primary Examiner* — Thai Pham
(74) *Attorney, Agent, or Firm* — Foley & Lardner LLP

(57) ABSTRACT

A semiconductor device package includes a substrate, an air cavity, a radiator, and a director. The substrate has a top surface. The air cavity is disposed within the substrate. The air cavity has a first sidewall and a second sidewall opposite to the first sidewall. The radiator is disposed adjacent to the first sidewall of the air cavity. The director is disposed adjacent to the second sidewall of the air cavity.

15 Claims, 13 Drawing Sheets

SEMICONDUCTOR DEVICE PACKAGE

BACKGROUND

1. Technical Field

The present disclosure relates to a semiconductor device package and a method of manufacturing the same, and more particularly to a semiconductor device package including an antenna module having at least two radiation directions and a method of manufacturing the same.

2. Description of the Related Art

Wireless communication devices, such as cell phones, typically include antennas for transmitting and receiving radio frequency (RF) signals. In recent years, with the continuous development of mobile communication and the pressing demand for high data rate and stable communication quality, relatively high frequency wireless transmission (e.g., 28 GHz or 60 GHz) has become one of the most important topics in the mobile communication industry. To improve transmission performance, it is desirable to provide an antenna module having a multi-directional radiation (e.g., an omnidirectional antenna module).

SUMMARY

In accordance with some embodiments of the present disclosure, a semiconductor device package includes a substrate, an air cavity, a radiator, and a director. The substrate has a top surface. The air cavity is disposed within the substrate. The air cavity has a first sidewall and a second sidewall opposite to the first sidewall. The radiator is disposed adjacent to the first sidewall of the air cavity. The director is disposed adjacent to the second sidewall of the air cavity.

In accordance with some embodiments of the present disclosure, a semiconductor device package includes a substrate, a first antenna, and a second antenna. The substrate has a trench at least partially penetrating the substrate. The trench has a first sidewall and a second sidewall opposite to the first sidewall. The first antenna is disposed adjacent to the first sidewall of the trench. The second antenna is disposed adjacent to the second sidewall of the trench. A space between the first antenna and the second antenna includes at least one transmission medium.

Figure 1A:
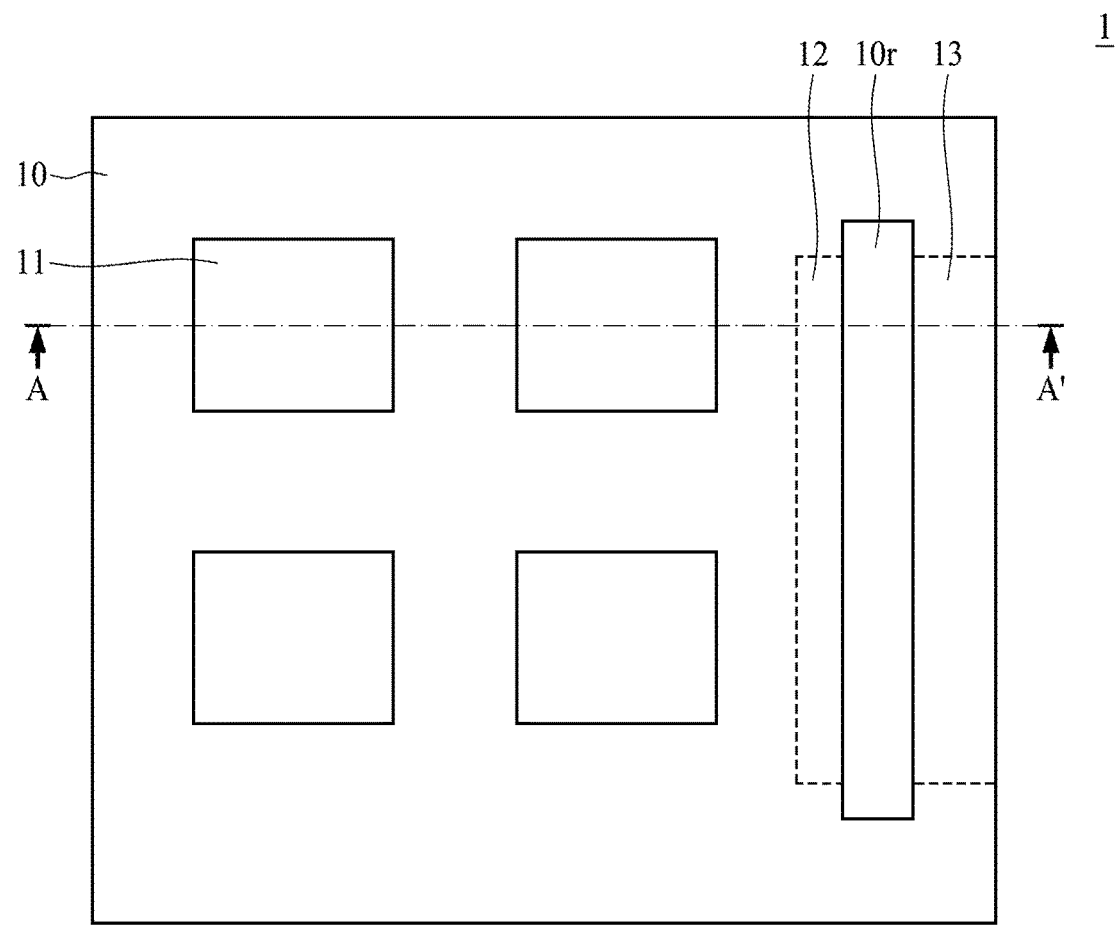
FIG. 1A illustrates a top view of a semiconductor device package, in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

Figure 1B:
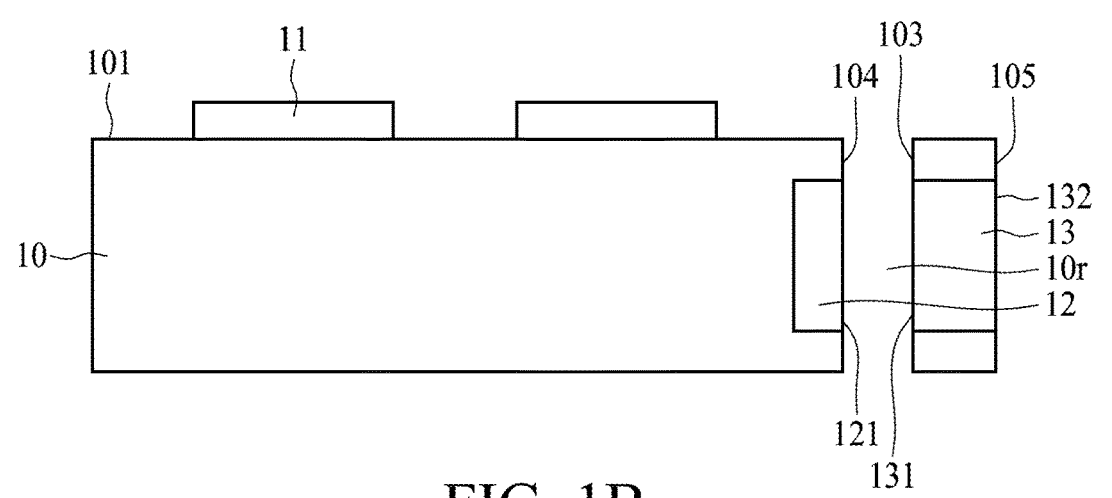
FIG. 1B illustrates a cross-sectional view of the semiconductor device package as shown in FIG. 1A, in accordance with some embodiments of the present disclosure.

FIG. 1A illustrates a top view of a semiconductor device package 1, in accordance with some embodiments of the present disclosure. FIG. 1B illustrates a cross-sectional view of the semiconductor device package 1 along the line A-A' as shown in FIG. 1A, in accordance with some embodiments of the present disclosure. The semiconductor device package 1 includes a substrate 10, an antenna 11, a radiator 12, and a director 13. In some embodiments, the semiconductor device package 1 may be or include an antenna module. In some embodiments, the semiconductor device package 1 may further include one or more electronic components (not shown) disposed on the substrate 10 and electrically connected to the antenna 11 and/or the radiator 12 through the substrate 10. In some embodiments, the radiator 12 and the director 13 may be collectively referred to as an antenna layer or an antenna structure.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element. In some embodiments, the substrate 10 may be a single-layer substrate or multi-layer substrate. The substrate 10 has a surface 101 (e.g., a top surface) and a surface 105 (e.g., a lateral surface) substantially perpendicular to the surface 101.

The substrate 10 includes a trench 10r (or a cavity). In some embodiments, the length and the width of the trench 10r are respectively less than the length and the width of the substrate 10. In some embodiments, the trench 10r is an air trench. The trench 10r is disposed adjacent to an edge of the substrate 10. As shown in FIG. 1B, the trench 10r fully penetrates the substrate 10. In some embodiments, a length of the trench 10r is less than a length of the edge of the substrate 10. For example, the trench 10r is fully surrounded by the substrate 10. As shown in FIG. 1B, the trench 10r may include a surface (e.g., a sidewall) 103 and a surface (e.g., a sidewall) 104 opposite to the surface 103. In some embodiments, a roughness of the surface 103 is substantially the same as a roughness of the surface 104. In some embodiments, the roughness of the surface 103 or the surface is different from a roughness of the surface 101 or the surface 105. For example, the roughness of the surface 103 or the surface is larger than the roughness of the surface 101 or the surface 105.

The antenna 11 is disposed on the surface 101 of the substrate 10. In some embodiments, there may be any number of antennas arranged in an array (e.g., an antenna array) on a surface 101 of the substrate 10. In some embodiments, the antenna 11 may be or include a patch antenna, a chip antenna or any other types of antenna. The antenna 11 may be configured to radiate electromagnetic waves in a direction mainly substantially perpendicular to the surface 101 of the substrate 10. The antenna 11 may be also configured to receive electromagnetic waves. In some embodiments, the antenna 11 may be or include a conductive material such as a metal or metal alloy. Examples of the conductive material include gold (Au), silver (Ag), copper (Cu), platinum (Pt), Palladium (Pd), other metal(s) or alloy(s), or a combination of two or more thereof.

The radiator 12 is partially disposed within the substrate 10. For example, a portion of the radiator 12 is embedded within the substrate 10 while a surface 121 of the radiator 12 is exposed from the substrate 10. The surface 121 of the radiator 12 is substantially coplanar with the surface 104 of the trench 10r. The radiator 12 may be configured to radiate electromagnetic waves in a direction mainly substantially parallel to the surface 101 of the substrate 10. The radiator 12 may be also configured to receive electromagnetic waves. The radiator 12 may be configured to transmit the electromagnetic waves to the director 13. The radiator 12 may be configured to receive the electromagnetic waves from the director 13. In some embodiments, the radiator 12 is electrically connected to a feeding line (not shown) within the substrate 10 and configured to transmit or receive data from an electronic component (not shown) through the feeding line.

In some embodiments, a roughness of the surface 121 of the radiator 12 is different from a roughness of other surfaces of the radiator 12 in contact with the substrate 10. For example, the roughness of the surface 121 of the radiator 12 is larger than the roughness of other surfaces of the radiator 12 in contact with the substrate 10. In some embodiments, the roughness of the surfaces of the radiator 12 in contact with the substrate 10 is in a range from about 0.1 micrometer (μm) to about 0.9 μm. In some embodiments, since the surface 121 of the radiator 12 may be formed by a cutting operation, the roughness of the surface 121 of the radiator 12 is larger than 1 μm. For example, the roughness of the surface 121 of the radiator 12 is in a range from about 1 μm to about 3 In some embodiments, the roughness of the surface 121 is substantially the same as the roughness of the surface 104. In some embodiments, the radiator 12 may be or include a conductive material such as a metal or metal alloy. Examples of the conductive material include Au, Ag, Cu, Pt, Pd, other metal(s) or alloy(s), or a combination of two or more thereof.

Figure 1C:
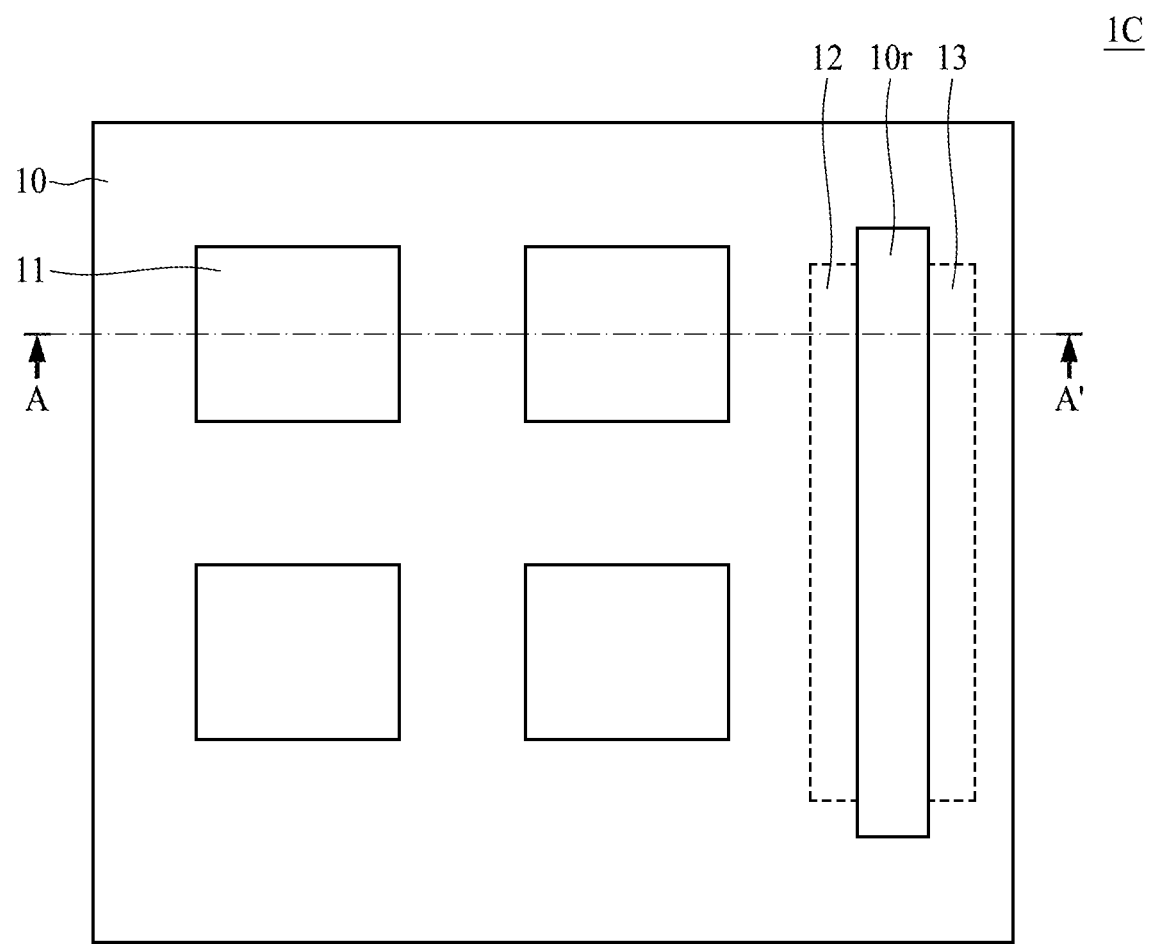
FIG. 1C illustrates a top view of a semiconductor device package, in accordance with some embodiments of the present disclosure.

The director 13 is partially disposed within the substrate 10. For example, a portion of the director 13 is embedded within the substrate 10 while surfaces 131 and 132 of the director 13 are exposed from the substrate 10. The surface 131 of the director 13 is substantially coplanar with the surface 103 of the trench 10r. The surface 132 of the director 13 is substantially coplanar with the surface 105 of a lateral surface 105 of the substrate 10. In other embodiments, the director 13 may be fully embedded within the substrate 10 to prevent oxidation. In some embodiments, as shown in FIG. 1C, the surface of the director 13 facing away from the radiator 12 is embedded within the substrate 10 while the surface of the director 13 facing the radiator 12 is exposed from the substrate 10. The director 13 may be configured to radiate electromagnetic waves in a direction mainly substantially parallel to the surface 101 of the substrate 10. The director 13 may be also configured to receive electromagnetic waves. The director 13 is disposed corresponding to the radiator 12. The director 13 may be configured to transmit the electromagnetic waves to the radiator 12. The director 13 may be configured to receive the electromagnetic waves from the radiator 12.

In some embodiments, a roughness of the surface 131 of the director 13 is different from a roughness of the surface 132 of the director 13 or other surfaces of the director 13 in contact with the substrate 10. For example, the roughness of the surface 131 of the director 13 is larger than the roughness of the surface 132 of the director 13 or other surfaces of the director 13 in contact with the substrate 10. In some embodiments, the roughness of the surface 131 is substantially the same as the roughness of the surface 103. In some embodiments, the director 13 may be or include a conductive material such as a metal or metal alloy. Examples of the conductive material include Au, Ag, Cu, Pt, Pd, other metal(s) or alloy(s), or a combination of two or more thereof.

In operation, the antenna 11 is configured to receive signal from one or more electronic components (not shown) through the interconnection structure of the substrate 10 and to radiate electromagnetic waves in the direction substantially perpendicular to the surface 101 of the substrate 10. The radiator 12 is configured to receive signal from one or more electronic components (not shown) through the interconnection structure of the substrate 10 and to radiate electromagnetic waves to the director 13. The director 13 is then configured to radiate the electromagnetic waves received from the radiator 12 in the direction substantially parallel to the surface 101 of the substrate 10. In other words, the semiconductor device package 1 can achieve a multi-directional radiation (vertical and horizontal).

In some embodiments, the substrate 10 may not include the trench 10r as shown in FIG. 1A. For example, the radiator 12 and the director 13 are fully covered or encapsulated by the substrate 10. For example, the transmission medium between the radiator 12 and the director 13 is the substrate 10. In general, the dielectric constant (Dk) of the substrate 10 is greater than 3, and the loss tangent or dissipation factor (Df) of the substrate 10 is greater than 0.003, even if the substrate 10 is formed of a dielectric material having low Dk and Df. This would adversely affect the performance of the radiator 12 and the director 13.

In accordance with the embodiments as shown in FIG. 1A and FIG. 1B, the surface 121 of the radiator 12 and the surface 131 of the director 13 are exposed from the substrate 10. For example, the transmission medium between the radiator 12 and the director 13 is air. Since air has a Dk and a Df (i.e., the Dk is 1 and the Df is 0) less than the Dk and the Df of any dielectric material, the radiator 12 and the director 13 can have a better performance for data transmission (especially for high-frequency signal). For example, a peak gain of the radiator 12 of the semiconductor device package 1 is about 1.3~2.3 times higher than a peak gain of the antenna without an air trench.

Figure 2A:
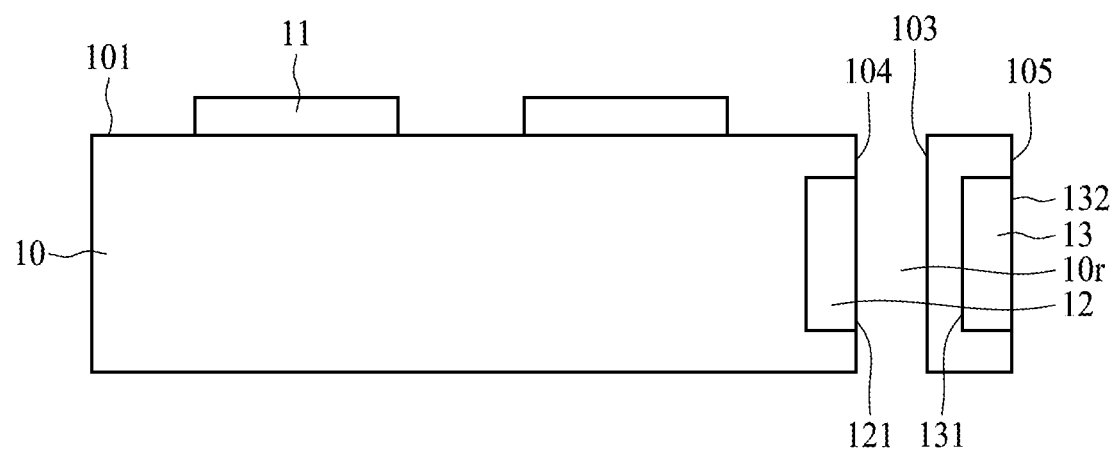
FIG. 2A illustrates a cross-sectional view of a semiconductor device package, in accordance with some embodiments of the present disclosure.

FIG. 2A illustrates a cross-sectional view of a semiconductor device package 2A, in accordance with some embodiments of the present disclosure. The semiconductor device package 2A is similar to the semiconductor device package 1 as shown in FIG. 1B, except that in FIG. 2A, the surface 131 of the director 13 is covered by the substrate 10. For example, the surface 131 of the director 13 is not exposed from the surface 103 of the substrate 10.

Figure 2B:
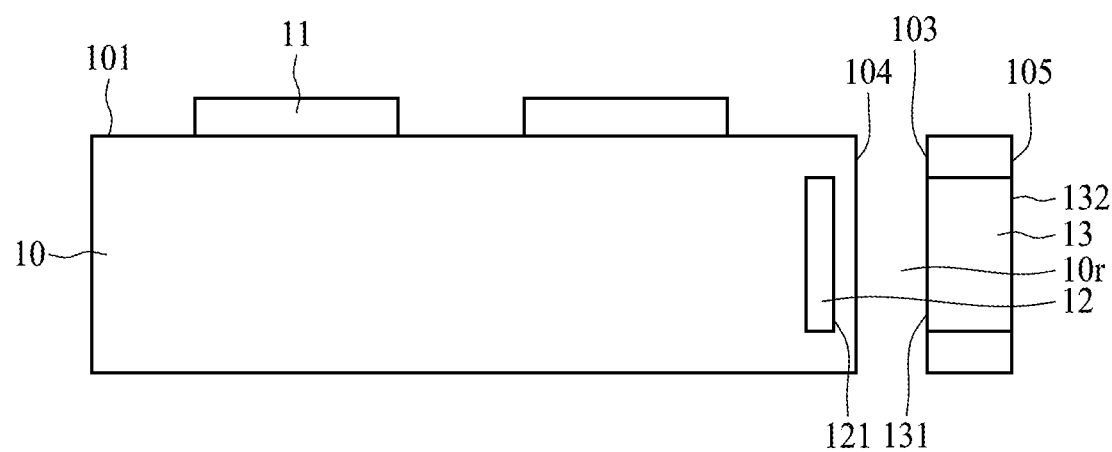
FIG. 2B illustrates a cross-sectional view of a semiconductor device package, in accordance with some embodiments of the present disclosure.

FIG. 2B illustrates a cross-sectional view of a semiconductor device package 2B, in accordance with some embodiments of the present disclosure. The semiconductor device package 2B is similar to the semiconductor device package 1 as shown in FIG. 1B, except that in FIG. 2B, the surface 121 of the radiator 12 is covered by the substrate 10. For example, the surface 121 of the radiator 12 not exposed from the surface 104 of the substrate 10.

Figure 2C:
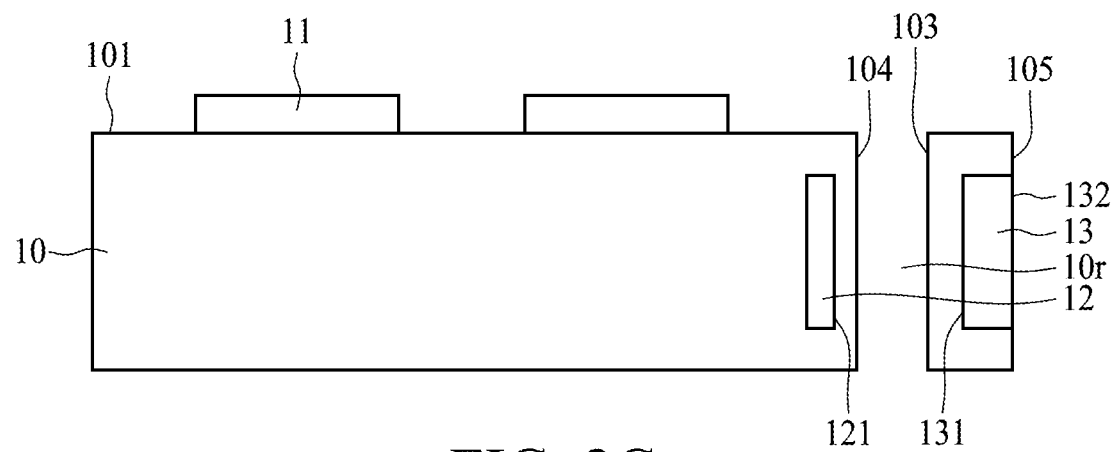
FIG. 2C illustrates a cross-sectional view of a semiconductor device package, in accordance with some embodiments of the present disclosure.

FIG. 2C illustrates a cross-sectional view of a semiconductor device package 2C, in accordance with some embodiments of the present disclosure. The semiconductor device package 2C is similar to the semiconductor device package 1 as shown in FIG. 1B, except that in FIG. 2C, both the surface 121 of the radiator 12 and the surface 131 of the director 13 are covered by the substrate 10. For example, the surface 121 of the radiator 12 not exposed from the surface 104 of the substrate 10. For example, the surface 131 of the director 13 is not exposed from the surface 103 of the substrate 10.

Figure 2D:
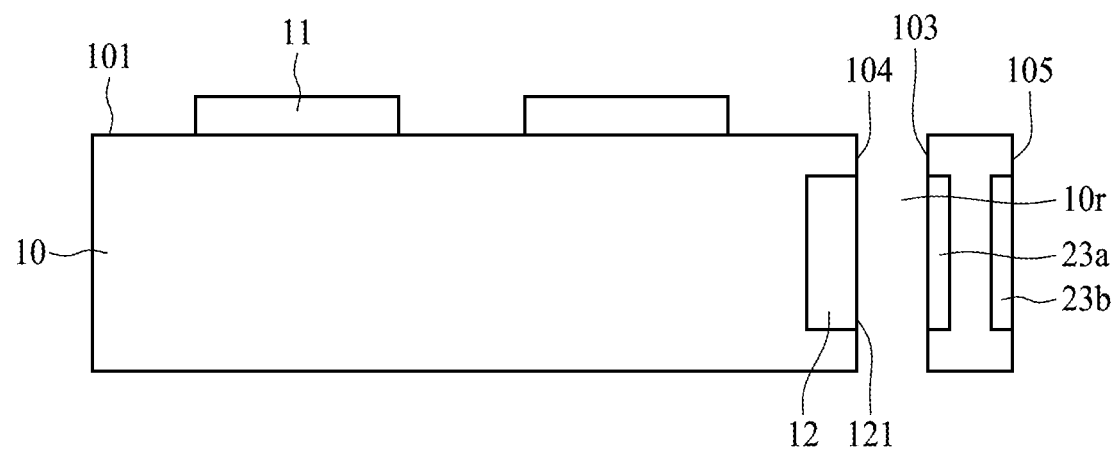
FIG. 2D illustrates a cross-sectional view of a semiconductor device package, in accordance with some embodiments of the present disclosure.

FIG. 2D illustrates a cross-sectional view of a semiconductor device package 2D, in accordance with some embodiments of the present disclosure. The semiconductor device package 2D is similar to the semiconductor device package 1 as shown in FIG. 1B, except that in FIG. 2D, the director 13 includes two parts 23a and 24b spaced apart from each other. For example, there is a gap between the part 23a and the part 23b of the director 13.

Figure 2E:
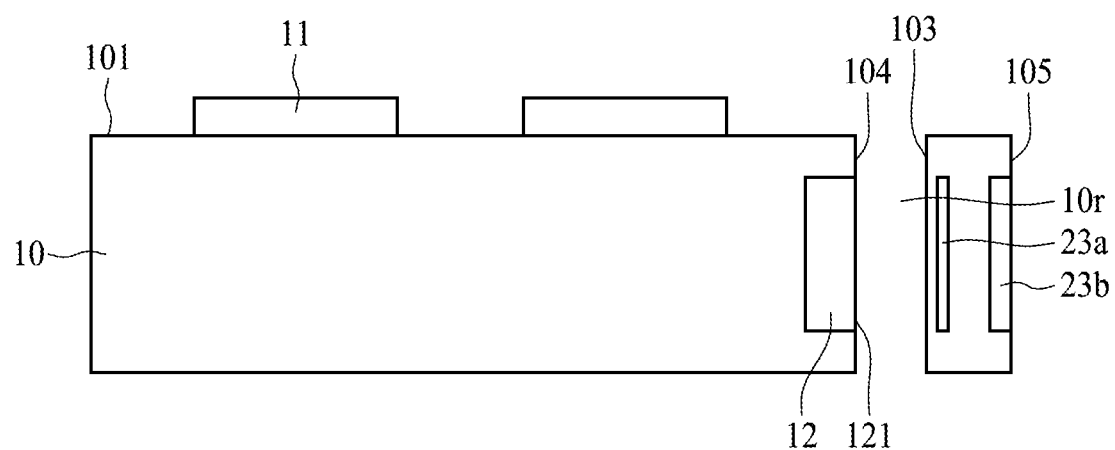
FIG. 2E illustrates a cross-sectional view of a semiconductor device package, in accordance with some embodiments of the present disclosure.

FIG. 2E illustrates a cross-sectional view of a semiconductor device package 2E, in accordance with some embodiments of the present disclosure. The semiconductor device package 2E is similar to the semiconductor device package 2A as shown in FIG. 2A, except that in FIG. 2E, the director 13 includes two parts 23a and 24b spaced apart from each other. For example, there is a gap between the part 23a and the part 23b of the director 13.

Figure 2F:
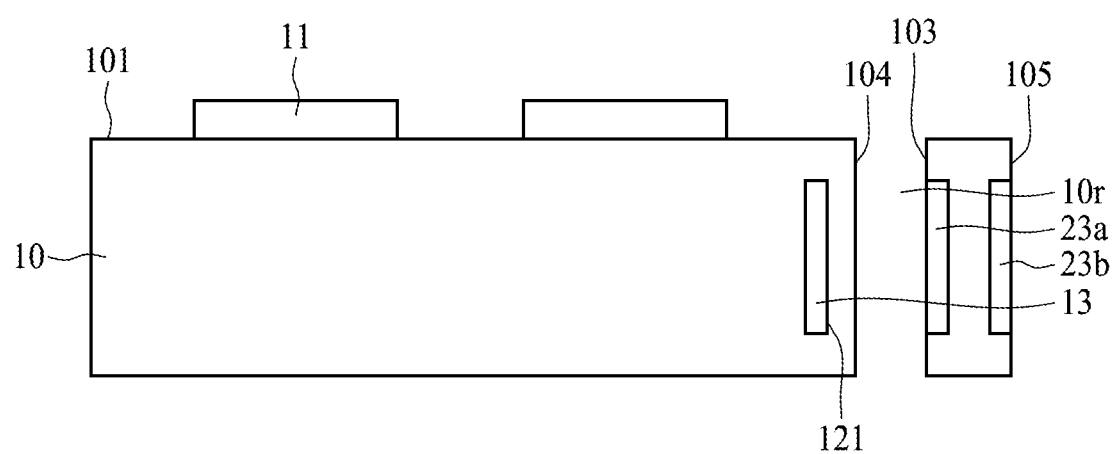
FIG. 2F illustrates a cross-sectional view of a semiconductor device package, in accordance with some embodiments of the present disclosure.

FIG. 2F illustrates a cross-sectional view of a semiconductor device package 2F, in accordance with some embodiments of the present disclosure. The semiconductor device package 2F is similar to the semiconductor device package 2B as shown in FIG. 2B, except that in FIG. 2F, the director 13 includes two parts 23a and 24b spaced apart from each other. For example, there is a gap between the part 23a and the part 23b of the director 13.

Figure 2G:
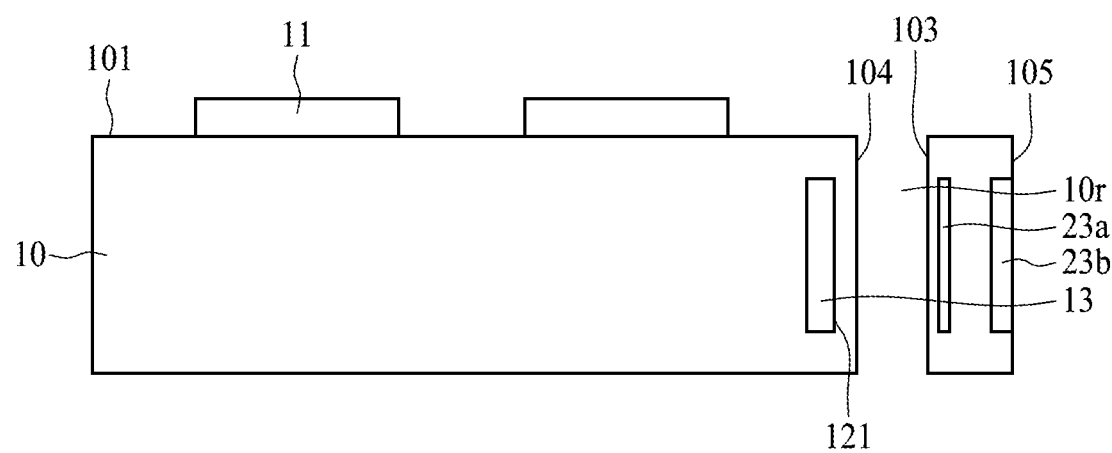
FIG. 2G illustrates a cross-sectional view of a semiconductor device package, in accordance with some embodiments of the present disclosure.

FIG. 2G illustrates a cross-sectional view of a semiconductor device package 2G, in accordance with some embodiments of the present disclosure. The semiconductor device package 2G is similar to the semiconductor device package 2C as shown in FIG. 2C, except that in FIG. 2G, the director 13 includes two parts 23a and 24b spaced apart from each other. For example, there is a gap between the part 23a and the part 23b of the director 13.

Figure 2H:
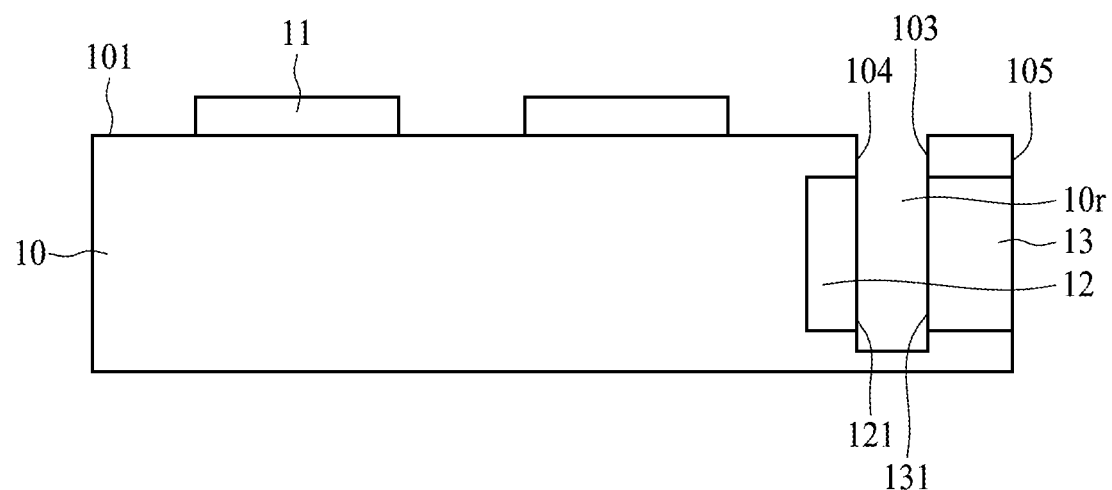
FIG. 2H illustrates a cross-sectional view of a semiconductor device package, in accordance with some embodiments of the present disclosure.

FIG. 2H illustrates a cross-sectional view of a semiconductor device package 2H, in accordance with some embodiments of the present disclosure. The semiconductor device package 2H is similar to the semiconductor device package 1 as shown in FIG. 1B, except that in FIG. 2H, the trench 10r does not fully penetrate the substrate 10. In some embodiments, a bottom surface of the trench 10r is lower than a bottom surface of the radiator 12 and a bottom surface of the director 13.

Figure 2I:
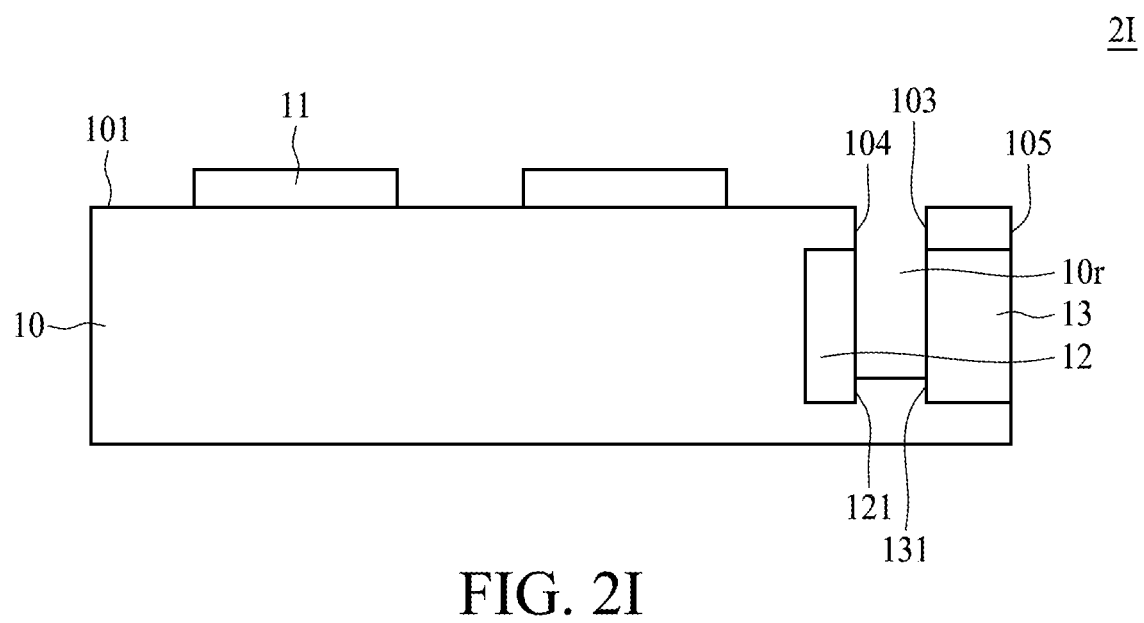
FIG. 2I illustrates a cross-sectional view of a semiconductor device package, in accordance with some embodiments of the present disclosure.

FIG. 2I illustrates a cross-sectional view of a semiconductor device package 2I, in accordance with some embodiments of the present disclosure. The semiconductor device package 2I is similar to the semiconductor device package 2H as shown in FIG. 2H, except that in FIG. 2I, the bottom surface of the trench 10r is higher than the bottom surface of the radiator 12 and the bottom surface of the director 13. This can prevent delamination between the radiator 12 or the director 13 and the substrate 10.

In some embodiments, the trench 10r may be filled with a material beneficial for the transmission of electromagnetic waves (e.g., the material having low Dk and Df). This can prevent the radiator 12 or the director 13 from being adversely affected by water vapor in the air.

Figure 3:
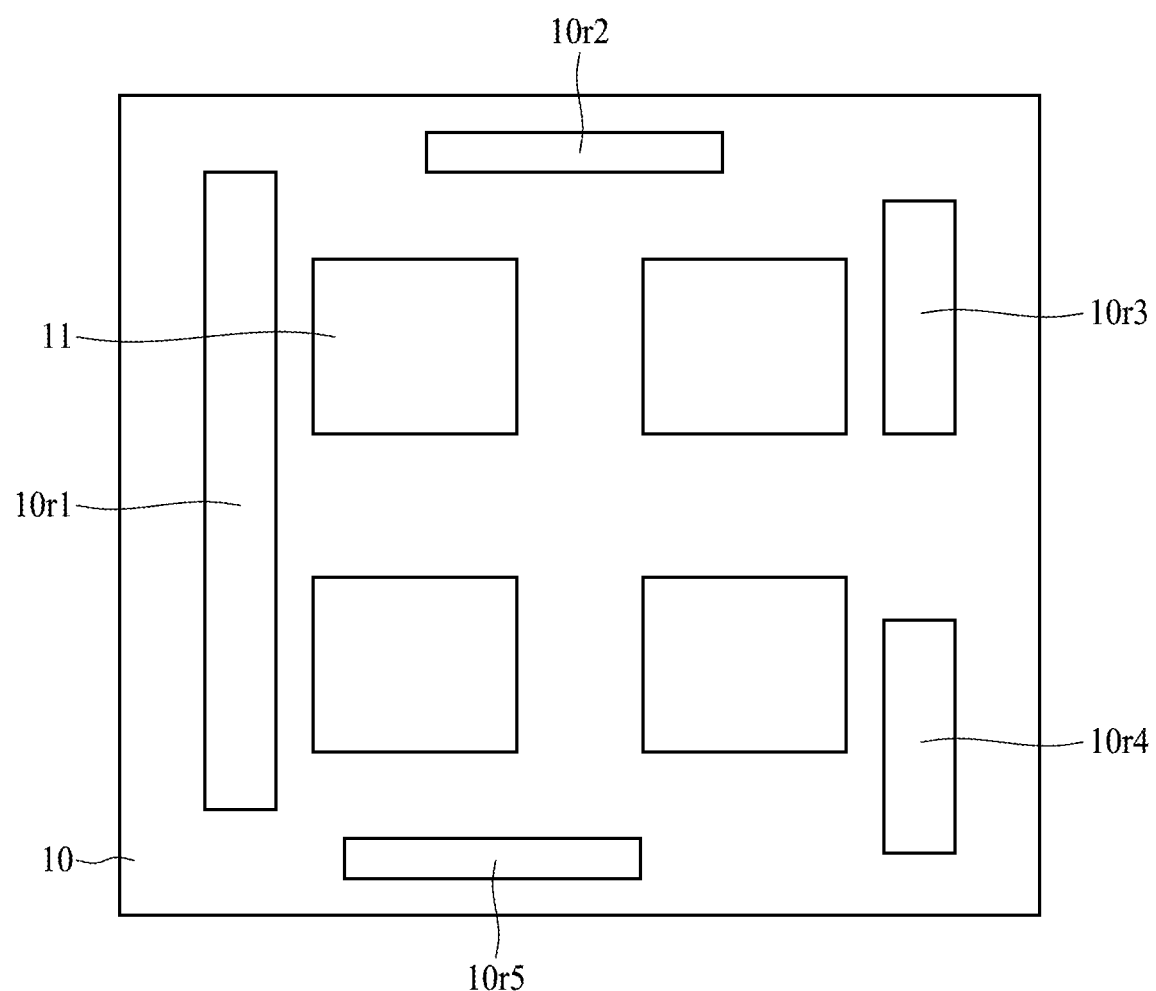
FIG. 3 illustrates a top view of a semiconductor device package, in accordance with some embodiments of the present disclosure.

FIG. 3 illustrates a top view of a semiconductor device package 3, in accordance with some embodiments of the present disclosure. The semiconductor device package 3 is similar to the semiconductor device package 1 as shown in FIG. 1A, except that the semiconductor device package 3 further includes a plurality of trenches 10r1, 10r2, 10r3, 10r4 and 10r5.

The trenches 10r1, 10r2, 10r3, 10r4 and 10r5 are disposed adjacent to edges of the substrate 10. In some embodiments, there is one trench (e.g., the trench 10r1, 10r2 or 10r5) adjacent to an edge of the substrate 10. In some embodiments, there are two trenches (e.g., the trench 10r3, 10r4) adjacent to an edge of the substrate 10. In some embodiments, there are N trenches adjacent to an edge of the substrate 10, where N is an integer equal to or greater than 1. In some embodiments, the trenches 10r1, 10r2, 10r3, 10r4 and 10r5 may include different lengths or widths. Alternatively, the trenches 10r1, 10r2, 10r3, 10r4 and 10r5 may include the same length or width.

Figure 4A:
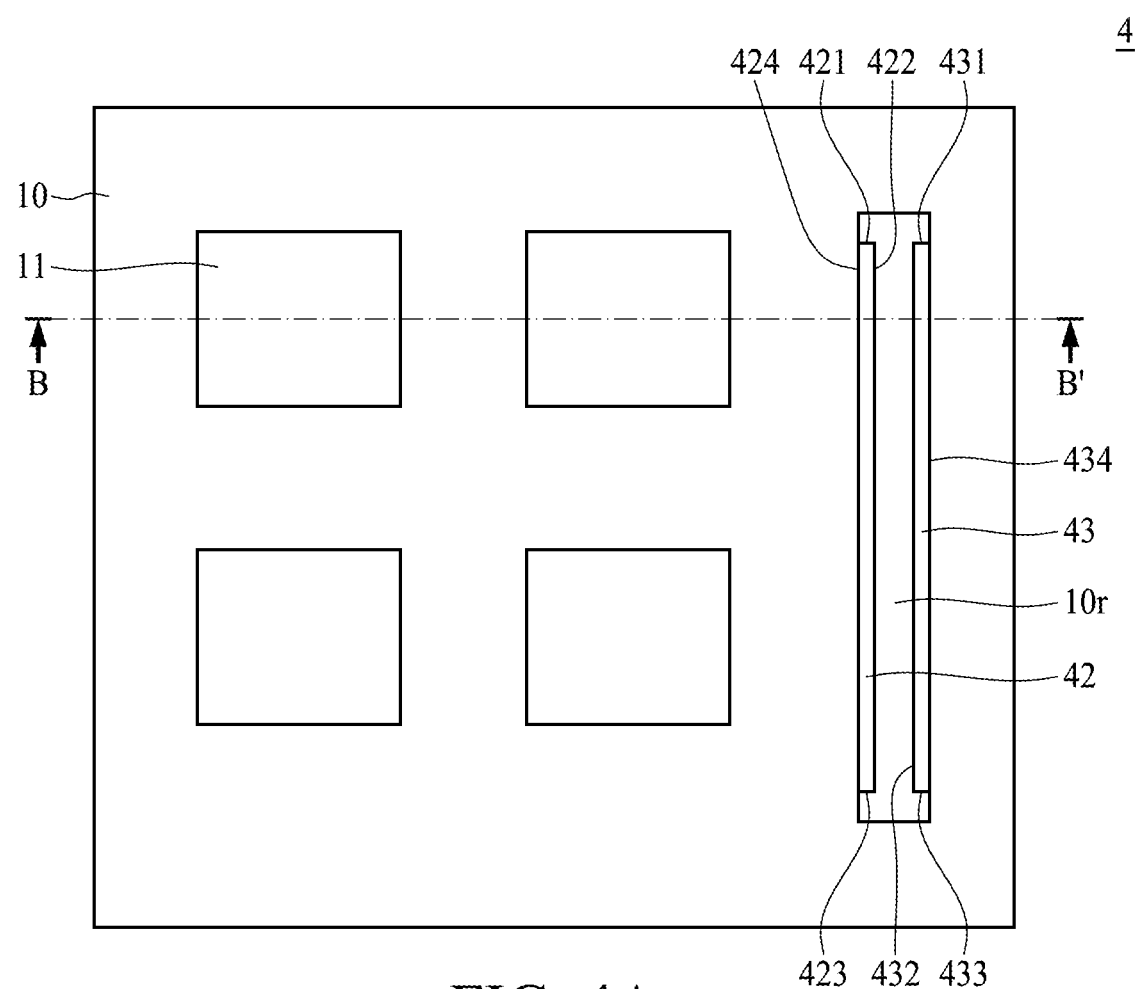
FIG. 4A illustrates a top view of a semiconductor device package, in accordance with some embodiments of the present disclosure.
Figure 4B:
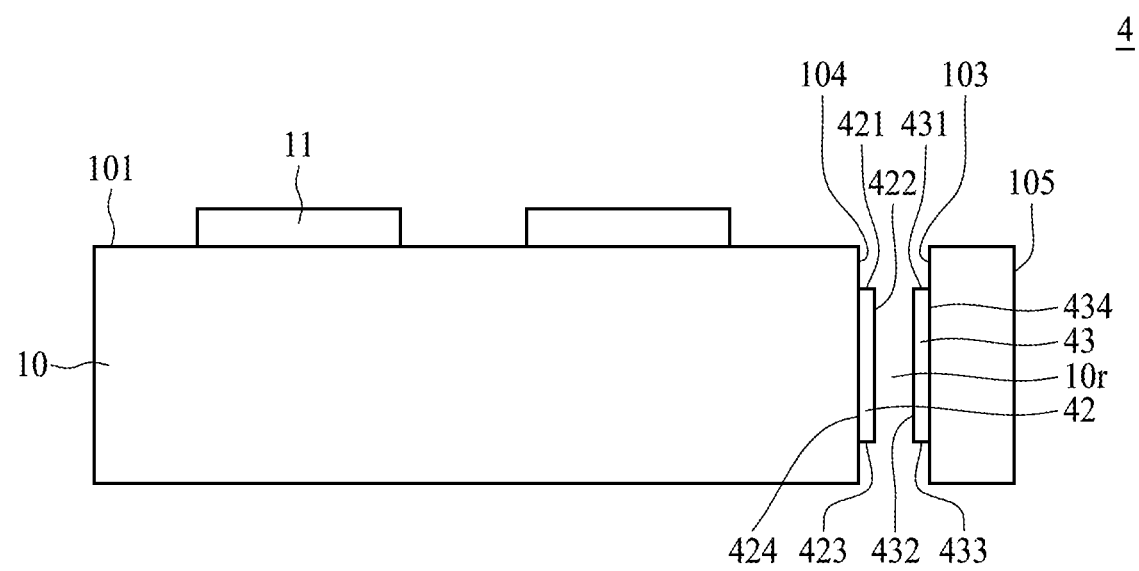
FIG. 4B illustrates a cross-sectional view of the semiconductor device package as shown in FIG. 4A, in accordance with some embodiments of the present disclosure.

FIG. 4A illustrates a top view of a semiconductor device package 4, in accordance with some embodiments of the present disclosure. FIG. 4B illustrates a cross-sectional view of the semiconductor device package 4 along the line B-B' as shown in FIG. 4A, in accordance with some embodiments of the present disclosure. The semiconductor device package 4 is similar to the semiconductor device package 1 as shown in FIG. 1A and FIG. 1B, and some of the differences therebetween are described below.

A radiator 42 is disposed on the surface 104 (the sidewall) of the trench 10r. For example, one surface (e.g., the surface 424) of the radiator 42 is in contact with the substrate 10 (e.g., the surface 104 of the substrate 10) while the other surfaces (e.g., the surfaces 421, 422 and 423) of the radiator 42 are exposed from the substrate 10.

A director 43 is disposed on the surface 103 (the sidewall) of the trench 10r. For example, one surface (e.g., the surface 434) of the director 43 is in contact with the substrate 10 (e.g., the surface 103 of the substrate 10) while the other surfaces (e.g., the surfaces 431, 432 and 433) of the director 43 are exposed from the substrate 10.

In accordance with the embodiments of FIG. 4A and FIG. 4B, only one surface of each of the radiator 42 and the director 43 is covered by the substrate 10 while other surfaces of each of the radiator 42 and the director 43 are exposed to air, and thus the performance for data transmission can be further improved. In some embodiments, the trench 10r of the semiconductor device package 4 may not fully penetrate the substrate 10 as shown in FIG. 2H and FIG. 2I.

Figure 4C:
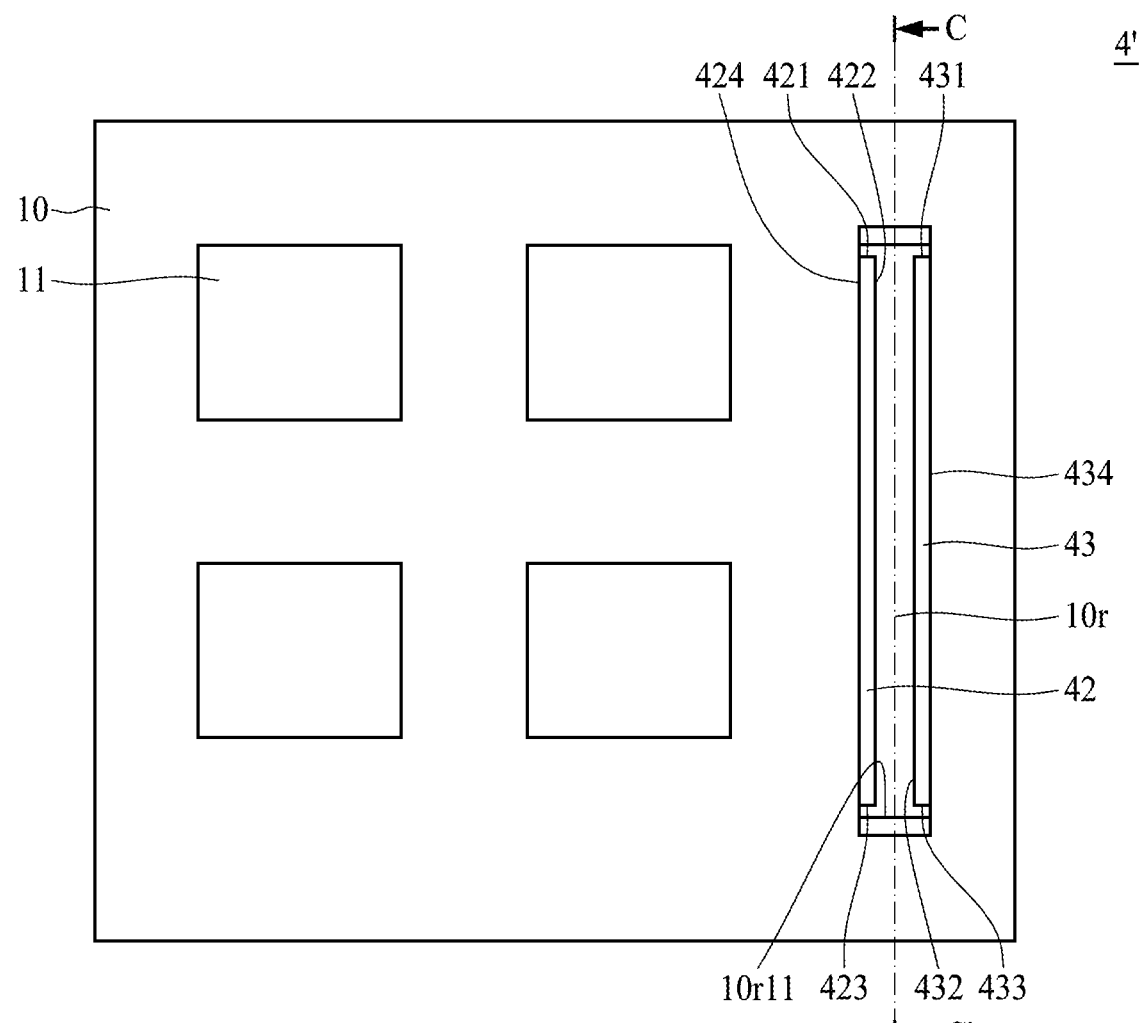
FIG. 4C illustrates a top view of a semiconductor device package, in accordance with some embodiments of the present disclosure.
Figure 4D:
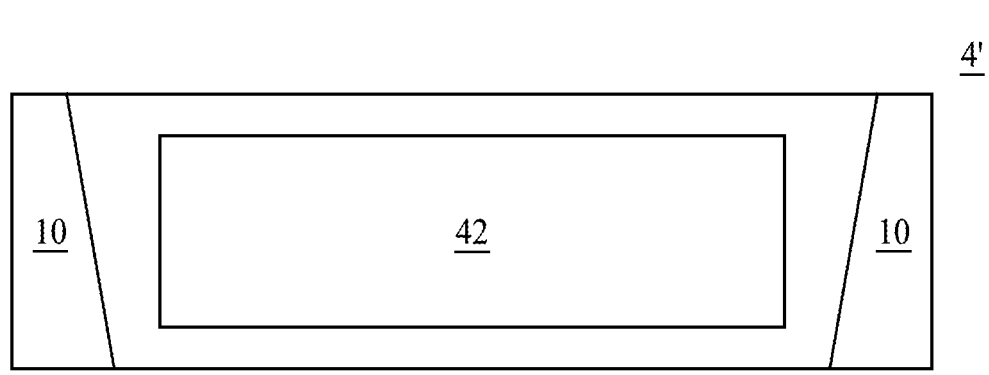
FIG. 4D illustrates a cross-sectional view of the semiconductor device package as shown in FIG. 4C, in accordance with some embodiments of the present disclosure.

FIG. 4C illustrates a top view of a semiconductor device package 4', in accordance with some embodiments of the present disclosure. FIG. 4D illustrates a cross-sectional view of the semiconductor device package 4' along the line C-C' as shown in FIG. 4C, in accordance with some embodiments of the present disclosure. The semiconductor device package 4' is similar to the semiconductor device package 4, and except that the trench 10r of the semiconductor device package 4' includes inclined lateral surfaces (or sidewall) 10r11. In some embodiments, the trench 10r of the semiconductor device package 4' is formed by laser cutting.

In some embodiments, one or more electronic components (e.g., chips or dies, which are not shown in the drawings) may be disposed on the bottom surface of the substrate. The electronic components may be configured to transmit signal to the radiator 42 through a feed line. In some embodiments, one or more electrical contacts (e.g., solder balls, which are not shown in the drawings) may be disposed on the bottom surface of the substrate 10 to provide electrical connections between the semiconductor device package 4 or 4' with external circuits. In some embodiments, a connector (e.g., a board to board connector or an interposer, which are not shown in the drawings) may be disposed on the top surface and/or the bottom surface of the substrate 10.

Figure 5A:
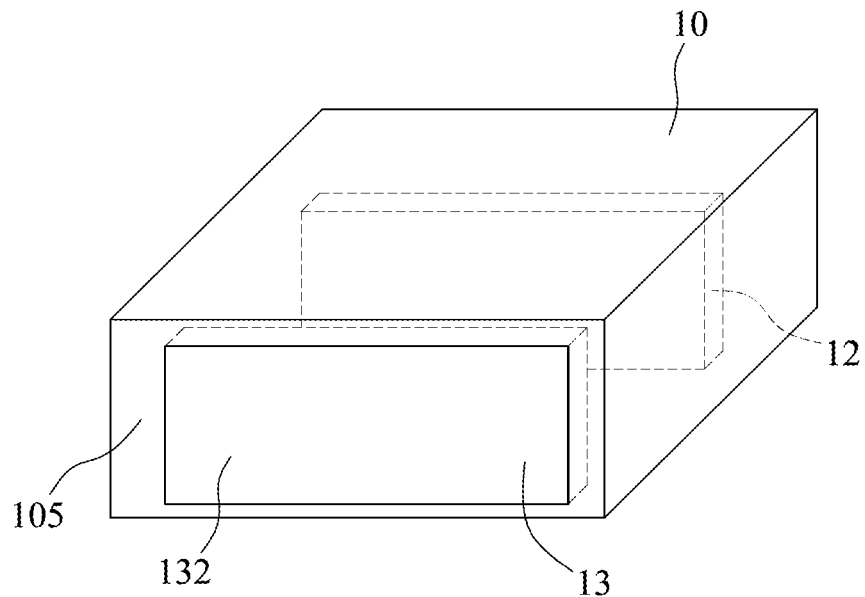
FIG. 5A and FIG. 5B illustrate perspective views of a semiconductor manufacturing method, in accordance with some embodiments of the present disclosure.
Figure 5B:
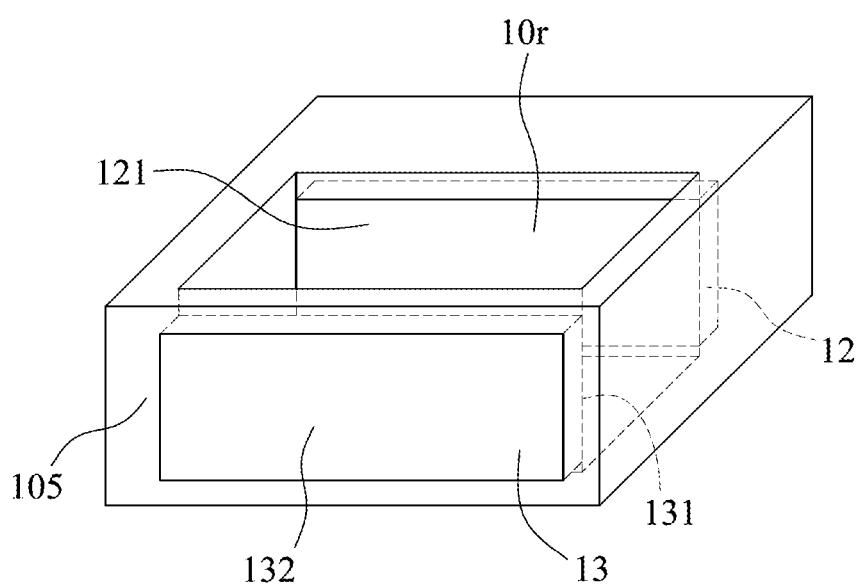

FIG. 5A and FIG. 5B illustrate perspective views of a semiconductor manufacturing method, in accordance with some embodiments of the present disclosure. In some embodiments, the method in FIG. 5A and FIG. 5B can be used to manufacture the semiconductor device package 1 as shown in FIG. 1A and FIG. 1B.

Referring to FIG. 5A, a substrate 10 is provided. A radiator 12 and a director 13 are disposed within the substrate 10. The radiator 12 is fully covered or encapsulated by the substrate 10. The director 13 is disposed adjacent to a surface 105 of the substrate 10. In some embodiments, the director 13 is exposed from the surface 105 of the substrate 10. For example, a surface 132 of the director 13 is substantially coplanar with the surface 105 of the substrate 10.

Referring to FIG. 5B, a trench 10r (or a cavity) between the radiator 12 and the director 13 is formed. In some embodiments, the trench 10r may be formed to fully penetrate the substrate 10 from a top surface of the substrate 10 to a bottom surface of the substrate 10. In some embodiments, the trench 10r may not be formed to fully penetrate the substrate 10. In some embodiments, a portion of the radiator 12 is exposed from the after the trench 10r has been formed. For example, a surface 121 of the radiator 12 is exposed from substrate 10. In some embodiments, a portion of the director is exposed from the after the trench 10r has been formed. For example, a surface 131 of the director 13 is exposed from substrate 10. In some embodiments, the trench 10r may be formed by, for example, a mechanical drilling, a laser drilling, etching or any other suitable operations.

One or more antennas (not shown) are then formed on the top surface of the substrate 10 to form the semiconductor device package 1 as shown in FIG. 1A and FIG. 1B. In other embodiments, the antennas may be formed prior to the formation of the trench 10r.

FIG. 6A, FIG. 6B, FIG. 6C and FIG. 6D illustrate perspective views of a semiconductor manufacturing method, in accordance with some embodiments of the present disclosure. In some embodiments, the method in FIG. 6A, FIG. 6B, FIG. 6C and FIG. 6D can be used to manufacture the semiconductor device package 4 as shown in FIG. 4A and FIG. 4B.

Figure 6A:
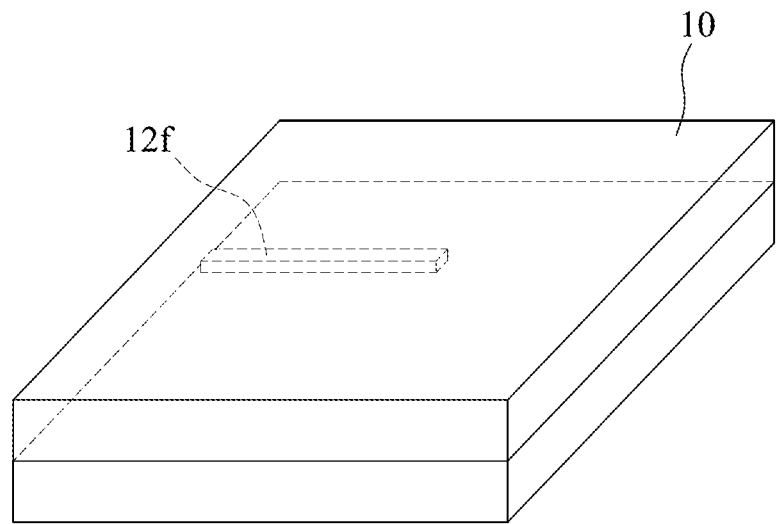
FIG. 6A, FIG. 6B, FIG. 6C and FIG. 6D illustrate perspective views of a semiconductor manufacturing method, in accordance with some embodiments of the present disclosure.

Referring to FIG. 6A, a substrate 10 is provided. The substrate 10 includes two or more layers. A feeding line 12f is disposed on one of the layers of the substrate 10 and covered by an upper layer. In some embodiments, the feeding line 12f is electrically connected with an electronic component (not shown).

Figure 6B:
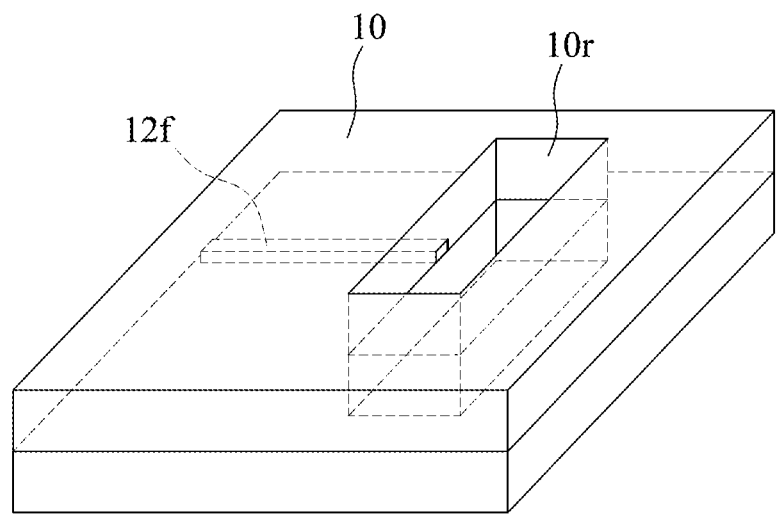

Referring to FIG. 6B, a trench 10r is formed. In some embodiments, the trench 10r may be formed to fully penetrate the substrate 10 from a top surface of the substrate 10 to a bottom surface of the substrate 10. In some embodiments, the trench 10r may not be formed to fully penetrate the substrate 10. In some embodiments, a portion of the feeding line is exposed from the after the trench 10r has been formed. In some embodiments, the trench 10r may be formed by, for example, a mechanical drilling, a laser drilling, etching or any other suitable operations.

Figure 6C:
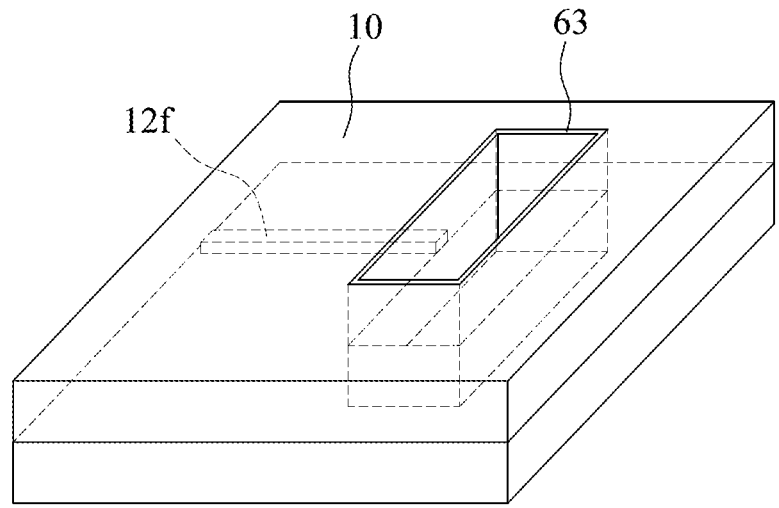

Referring to FIG. 6C, a patterned conductive layer 63 is formed on lateral surfaces (or sidewall) of the trench 10r. The patterned conductive layer 63 is in contact with the exposed portion of the feeding line 12f. The patterned conductive layer 63 is disposed on all the lateral surfaces of the trench 10r. For example, the patterned conductive layer 63 surrounds the trench 10r. In some embodiments, the patterned conductive layer 63 may be formed by, for example, plating or any other suitable operations.

Figure 6D:
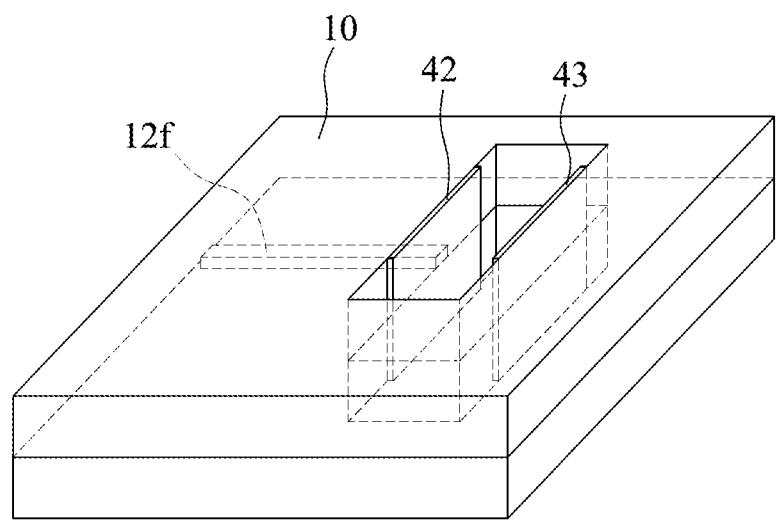

Referring to FIG. 6D, a portion of the patterned conductive layer 63 is removed to form a radiator 42 and a director 43. For example, the portion of the patterned conductive layer 43 connecting the radiator 42 with the director 43 is removed to separate the radiator 42 from the director 43.

One or more antennas (not shown) are then formed on the top surface of the substrate 10 to form the semiconductor device package 4 as shown in FIG. 4A and FIG. 4B. In other embodiments, the antennas may be formed prior to the formation of the trench 10r.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a substrate having a top surface;
   an air cavity within the substrate, the air cavity having a first sidewall and a second sidewall opposite to the first sidewall;
   a radiator disposed adjacent to the first sidewall of the air cavity; and
   a director disposed adjacent to the second sidewall of the air cavity;
   wherein one surface of each of the radiator and the director is covered by the substrate while other surfaces of each of the radiator and the director are exposed to air, and thus for improving transmission performance of antenna module; and
   wherein the radiator is configured to radiate electromagnetic waves in a direction parallel to the top surface of the substrate.

2. The semiconductor device package of claim 1, wherein the radiator has a first surface exposed from the first sidewall.

3. The semiconductor device package of claim 2, wherein the radiator has a second surface opposite to the first surface of the radiator, and wherein the second surface of the radiator is substantially coplanar with the first sidewall.

4. The semiconductor device package of claim 3, wherein a roughness of the first surface of the radiator is different from a roughness of the second surface of the radiator.

5. The semiconductor device package of claim 3, wherein the radiator has a third surface extended from the first surface of the radiator to the second surface of the radiator, and wherein the third surface of the radiator is spaced apart from a third sidewall of the air cavity extended from the first sidewall of the air cavity to the second sidewall of the air cavity.

6. The semiconductor device package of claim 5, wherein the radiator has a fourth surface extended from the first surface of the radiator to the second surface of the radiator, and wherein the fourth surface of the radiator is substantially parallel to the top surface of the substrate.

7. The semiconductor device package of claim 5, wherein the third sidewall of the air cavity extended from the top surface of the substrate to a bottom surface of the substrate, and wherein a distance between the third sidewall of the air cavity and a lateral surface of the substrate becomes greater in a direction from the top surface of the substrate toward the bottom surface of the substrate.

8. The semiconductor device package of claim 1, wherein the director has a first surface exposed from the second sidewall.

9. The semiconductor device package of claim 8, wherein the director has a second surface opposite to the first surface of the director, and wherein the second surface of the director is substantially coplanar with the second sidewall.

10. The semiconductor device package of claim 9, wherein the director has a third surface extended from the first surface of the director to the second surface of the director, and wherein the third surface of the director is spaced apart from a third sidewall of the air cavity.

11. The semiconductor device package of claim 10, wherein a roughness of the third surface of the director is different from a roughness of the first surface and the second surface of the director.

12. The semiconductor device package of claim 1, wherein the air cavity fully penetrates the substrate from the top surface of the substrate to a bottom surface of the substrate.

13. The semiconductor device package of claim 12, wherein the air cavity and the top surface of the substrate define a first opening, the air cavity and the bottom surface of the substrate define a second opening, and wherein a width of the first opening is greater than a width of the second opening.

14. The semiconductor device package of claim 1, wherein the radiator protrudes from the first sidewall and the director protrudes from the second sidewall.

15. The semiconductor device package of claim 14, wherein
the radiator has a surface in contact with the first sidewall, and other surfaces of the radiator are exposed from the substrate; and
the director has a surface in contact with the second sidewall, and other surfaces of the radiator are exposed from the substrate.

\* \* \* \* \*